United States Patent
Ham et al.

(10) Patent No.: US 7,135,703 B2
(45) Date of Patent: Nov. 14, 2006

(54) TEST TRAY WITH CARRIER MODULES FOR A SEMICONDUCTOR DEVICE HANDLER

(75) Inventors: Chul Ho Ham, Seongnam-shi (KR); Chan Ho Park, Chonan-shi (KR); Woo Young Lim, Seoul (KR); Jae Bong Seo, Seongnam-shi (KR)

(73) Assignee: Mirae Corporation, Chungchengnam-Do (KR)

( * ) Notice: Subject to any disclaimer, the term of this patent is extended or adjusted under 35 U.S.C. 154(b) by 0 days.

(21) Appl. No.: 10/366,618

(22) Filed: Feb. 14, 2003

(65) Prior Publication Data

US 2004/0016993 A1 Jan. 29, 2004

(30) Foreign Application Priority Data

Jul. 24, 2002 (KR) .................. 10-2002-0043681

(51) Int. Cl.
*B65D 73/02* (2006.01)
(52) U.S. Cl. .................. 257/48; 257/686; 206/724; 206/328; 206/486; 206/560; 206/334; 206/725; 206/331; 361/212; 361/807; 361/810; 361/767; 439/73; 324/762; 174/52.4; 73/856
(58) Field of Classification Search .................. 257/48, 257/686; 206/724, 328, 486, 560, 334, 725, 206/331, 332; 361/212, 526, 70, 525, 632; 324/762; 174/52.4; 53/242, 246, 222; 29/827; 73/856
See application file for complete search history.

(56) References Cited

U.S. PATENT DOCUMENTS 4,329,642 A * 5/1982 Luthi et al. .................. 324/755
4,535,887 A * 8/1985 Egawa ........................ 206/724
4,681,221 A * 7/1987 Chickanosky et al. ...... 206/719
4,881,639 A * 11/1989 Matsuoka et al. .......... 206/724
5,026,303 A * 6/1991 Matsuoka et al. .......... 439/526
5,226,226 A * 7/1993 Fierkens ..................... 29/827
5,375,320 A * 12/1994 Kinsman et al. ............. 29/827
5,675,957 A * 10/1997 Kim ........................... 53/242
5,750,421 A * 5/1998 Kasai et al. ................ 438/106
6,627,483 B1 * 9/2003 Ondricek et al. ........... 438/117
6,644,982 B1 * 11/2003 Ondricek et al. ............. 439/73

FOREIGN PATENT DOCUMENTS

JP 59057463 4/1984
JP 09329643 12/1997

OTHER PUBLICATIONS

Japanese Office Action dated Feb. 24, 2006.

* cited by examiner

*Primary Examiner*—Alexander Oscar Williams
(74) *Attorney, Agent, or Firm*—Fleshner & Kim, LLP

(57) ABSTRACT

A carrier module for a semiconductor device handler, in which grooves for flow of cooling fluid are formed in a seating surface of the carrier module for the semiconductor device. The grooves improve cooling efficiency by forcing the cooling fluid sprayed from a test temperature deviation compensating system onto the carrier module to spread throughout substantially an entire surface of the semiconductor device, and to remain in the carrier module for a period of time before being discharged.

23 Claims, 5 Drawing Sheets

TEST TRAY WITH CARRIER MODULES FOR A SEMICONDUCTOR DEVICE HANDLER

BACKGROUND OF THE INVENTION

1. Field of the Invention

The invention relates to a carrier module configured to be fitted to a test tray in a semiconductor device handler.

2. Background of the Related Art

In general, both memory and non-memory semiconductor devices, or modular ICs with semiconductor devices arranged on a substrate to form a circuit, are subjected to various tests after fabrication but prior to shipment. The semiconductor device handler (hereafter referred to as "handler") is an apparatus for automatic testing of semiconductor devices, modular ICs, and the like. The handler carries out a test according to the following process.

First, a worker loads trays of semiconductor devices or modular ICs to be tested onto a loading stacker of the handler. The semiconductor devices or modular ICs are then loaded on test trays and transported to a test site. At the test site, leads of the semiconductor device are electrically connected to a test socket and tested. Once testing is complete, the semiconductor devices are removed from the test trays and loaded on user trays based on test results, to classify the semiconductor devices.

In general, the handlers have a system for carrying out not only general performance tests at room temperature, but also high temperature or low temperature tests to determine if the semiconductor devices or the modular ICs can perform normally under extreme temperature conditions. To perform such tests, an extreme high or low temperature environment is formed by providing an electric heater, or a liquefied gas spray system within an enclosed chamber at the test site.

However, carrying out a temperature test of a semiconductor device using a handler poses a problem. The semiconductor device itself generates heat while it is electrically connected to the test socket which impedes carrying out the test at an exact preset temperature. This is a problem which must be solved, both in the test environment and actual application environment, as semiconductor devices become smaller and packing densities increase.

For example, in a high temperature test, if a user sets the temperature inside the chamber to 80° C. for the test, the test can be carried out at the set temperature of 80° C. if there is no additional heat generated by the semiconductor device itself. However, if heat is generated by the semiconductor device during the test, causing a test temperature deviation of, for example, approximately 15° C., the test is actually carried out at 95° C. In this case, the test of the semiconductor device is carried out at a temperature higher than the set temperature, resulting in decreased yield and reliability as the test has not been conducted at the exact set temperature.

To cope with this, there has been research into a system for compensating for test temperature deviation in which a cooling fluid formed by mixing a liquefied gas, such as liquefied nitrogen, and dry air is sprayed directly onto the semiconductor device from one side of the semiconductor device in order to test the semiconductor device at an exact temperature or within an exact temperature range. However, in spraying the cooling fluid onto the semiconductor device, the carrier module structure can impede uniform spreading of the sprayed cooling fluid over an entire surface of the semiconductor device, which decreases efficiency of the test temperature deviation compensation system.

FIGS. 1 to 3 show a related art carrier module 10 with a carrier body 11, in this case rectangular and formed, for example, of plastic, configured to be held in a test tray, a seating recess 12 in the carrier body 11, a heat dissipation block 13 that forms a bottom of the seating recess 12 and receives the semiconductor device 20 thereon, and a pair of latches 15 provided at opposite sides of the seating recess 12 that hold the semiconductor device 20 seated on the heat dissipation block 13.

The heat dissipation block 13 is formed of a material with good heat conductivity, for example, a metal such as aluminum, to improve cooling of the semiconductor device 20. The heat dissipation block 13 has a central pass through hole 14 configured to guide cooling fluid sprayed from a nozzle 30 of a test temperature deviation compensation device (not shown) to the semiconductor device 20. The heat dissipation block 13 has a plurality of guide ribs 17 formed on a bottom thereof that guide the cooling fluid toward the pass through hole 14 to enhance a heat dissipation effect, and a plurality of air holes 18 at both sides of a lower portion of the carrier body 11 where the guide ribs 17 are formed and configured to discharge the sprayed cooling fluid to outside of the carrier body 11 through both sides of the lower portion of the carrier body 11.

However, the related art carrier module 10 has a problem in that overall cooling efficiency is poor, due to a large difference in cooling performance between a central portion and a periphery of the semiconductor device. This difference in cooling performance is caused by concentration of the cooling fluid, which is passed through the pass through hole 14 in the heat dissipation block 13, at a central portion of the semiconductor device, as the top surface of the heat dissipation block 13 is flat, and the semiconductor device 20 is seated thereon.

Moreover, the direct discharge of the cooling fluid outside of the carrier body 11 through the air holes 18 formed in sides of the carrier body 11 causes a drop in cooling efficiency, as the cooling fluid is discharged before its full cooling capacity has been expended in cooling of the entire heat dissipation block 13.

SUMMARY OF THE INVENTION

An object of the invention is to solve at least the above problems and/or disadvantages and to provide at least the advantages described hereinafter.

Accordingly, the invention is directed to a test tray configured to carry a plurality of semiconductor devices in a test handler that substantially obviates one or mote of the problems due to limitations and disadvantages of the related art.

To achieve these and other advantages and in accordance with the purpose of the invention, as embodied and broadly described, a test tray configured to carry a plurality of semiconductor devices in a test handler is provided, with carrier modules configured to be fitted to the test tray and detachably hold the semiconductor device, the carrier module comprising a carrier body configured to be positioned on a test tray, a device seating part on a top surface of the carrier body configured to receive a semiconductor device, a device seating part on a top surface of the carrier body configured to receive a semiconductor device, at least one holding member configured to detachably hold the semiconductor device on the device seating part, a pass through hole formed in the device seating part configured to pass cooling fluid pass therethrough, and a plurality of guide grooves formed in a surface of the device seating part in fluid communication with the pass through hole and configured to guide cooling fluid, sprayed onto a lower side of the carrier body and passed through the pass through hole, across portions of the surface of the semiconductor device extending to the periphery of the semiconductor device.

To achieve these and other advantages and in accordance with the purpose of the invention, as embodied and broadly described, a carrier module is provided for a semiconductor device handler, the carrier module being fitted to a test tray in a semiconductor device handler for detachably holding the semiconductor device, and including a substantially rectangular body for fitting to a test tray, a device seating part formed as a recess in a top surface of the body for seating the semiconductor device, one pair of holding members fitted to opposite sides of the device seating part for detachably holding the semiconductor device seated on the device seating part, a pass through hole formed in the device seating part to pass therethrough, a plurality of guide grooves in a surface of the device seating part the semiconductor device is to be seated thereon opened to the pass through hole, for guiding cooling fluid, sprayed from a lower side of the body and passed through the pass through hole, to an entire surface of the semiconductor device, and a plurality of guide ribs formed as one unit with the body extended from a lower part of the body vertically, for guiding the cooling fluid sprayed from a lower side of the body toward the pass through hole.

The plurality of guide ribs may be in the form of a hexahedron with an opened lower surface, to surround a part having the pass through hole formed therein.

Thus, the carrier module for a semiconductor device handler of the invention can improve a cooling performance and make temperature control easy because the cooling fluid sprayed to the carrier module flows over the surface of the semiconductor device to cool down the semiconductor device.

Moreover, because the cooling fluid sprayed into a space between the guide ribs of the carrier module is guided to the pass through hole while the cooling fluid stays in the space between the guide ribs, improved cooling performance can be provided in comparison to the related art carrier module.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
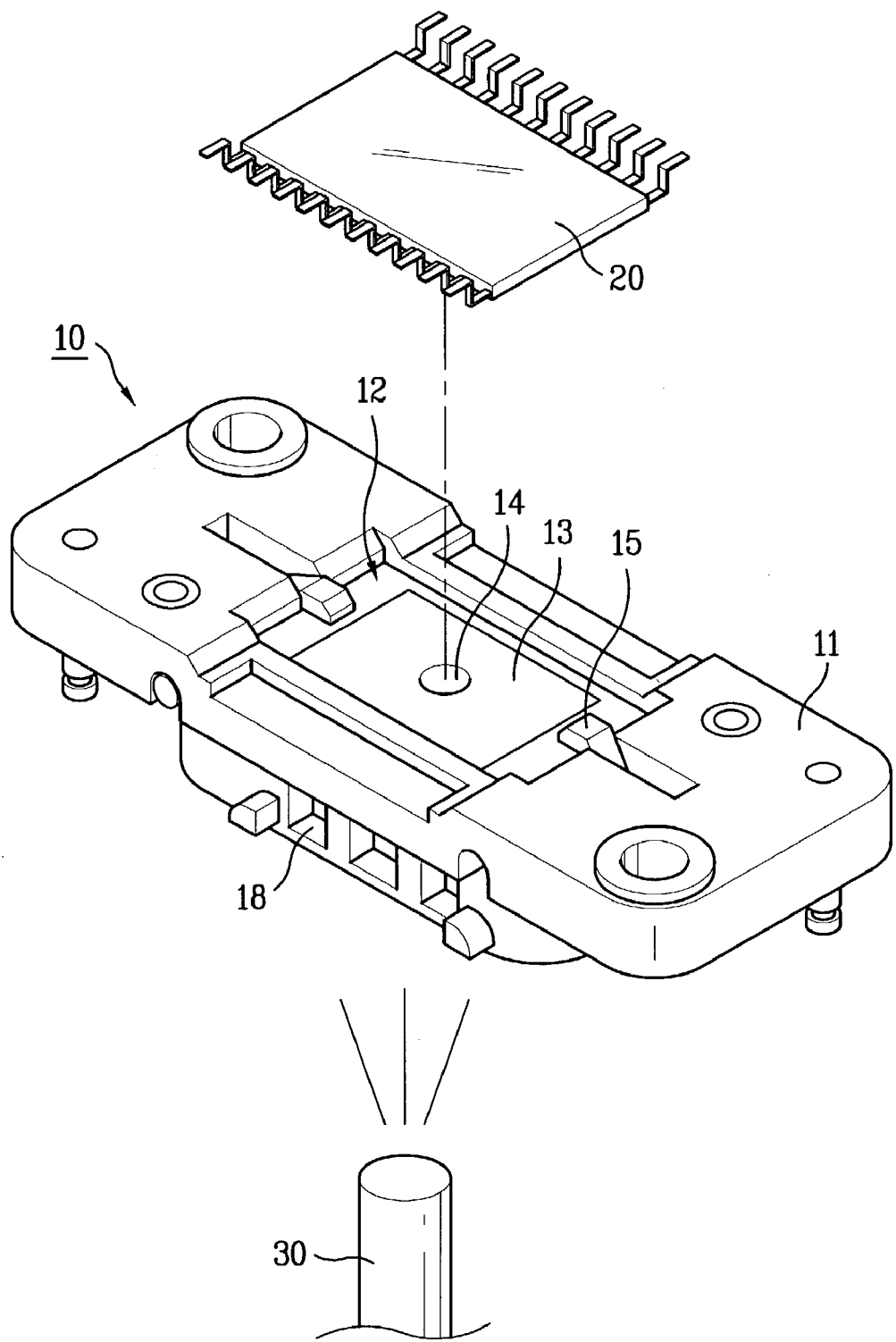
FIG. 1 is a perspective view of a related art carrier module for a semiconductor device handler.
Figure 2:
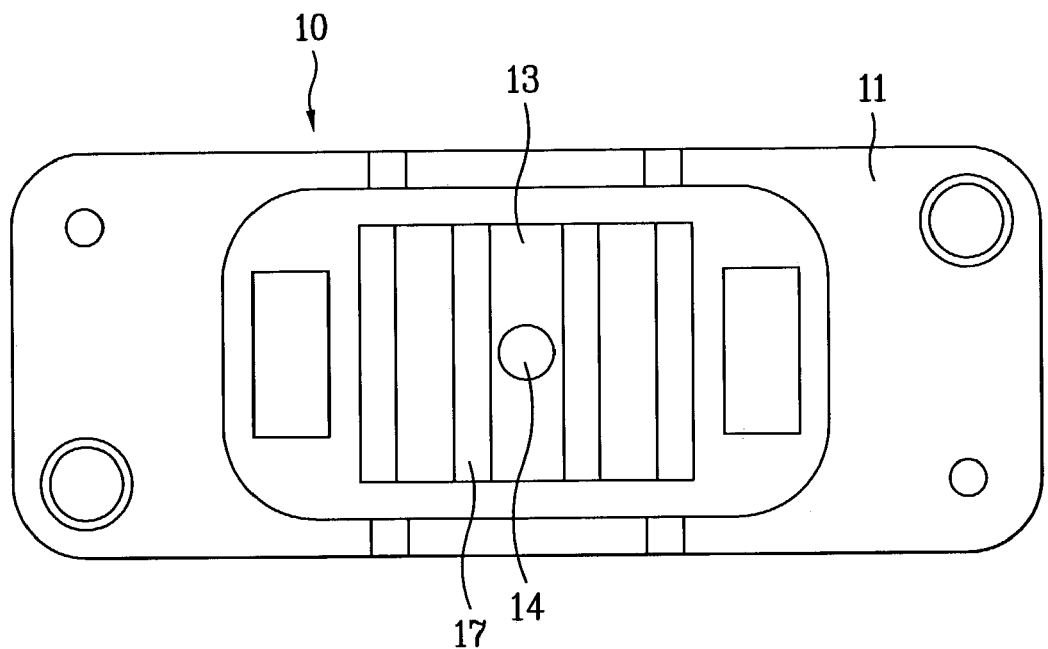
FIG. 2 is a bottom view of the carrier module in FIG. 1.
Figure 3:
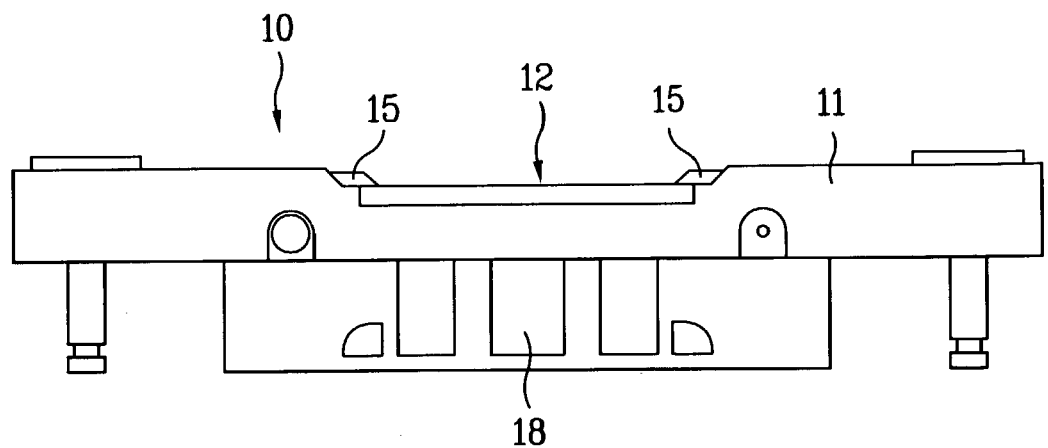
FIG. 3 is a side view of the carrier module in FIG. 1.
Figure 4:
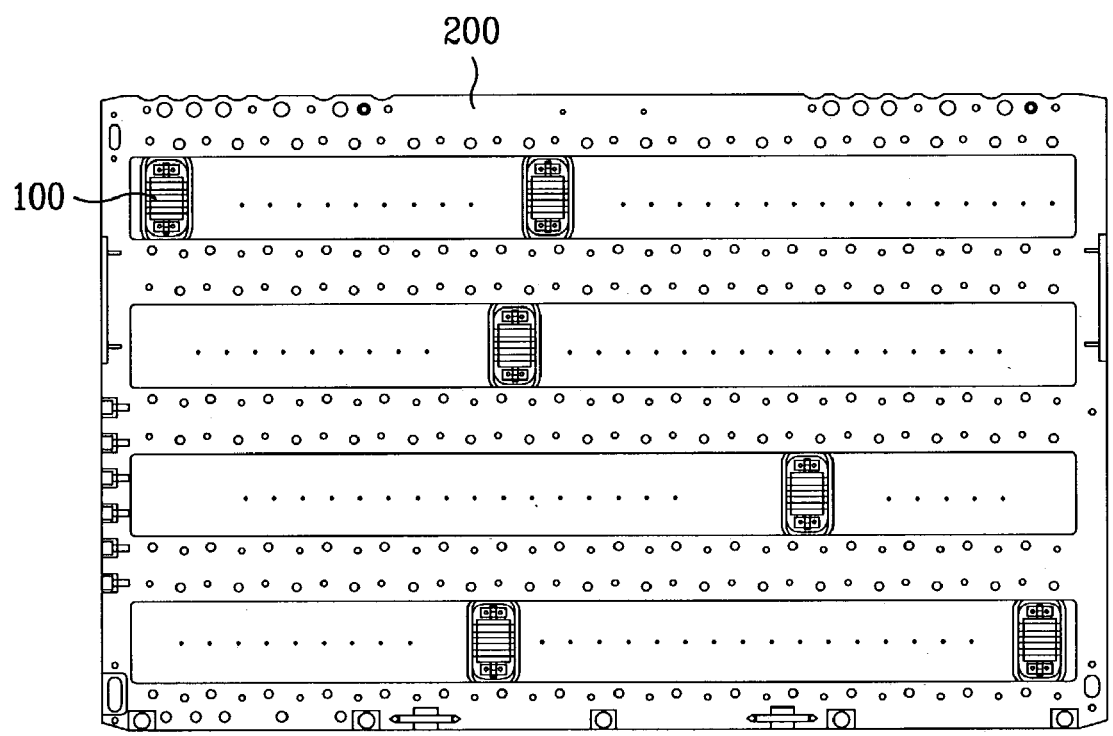
FIG. 4 is a schematic view of the test tray and carrier module in accordance with an embodiment of the invention.
Figure 5:
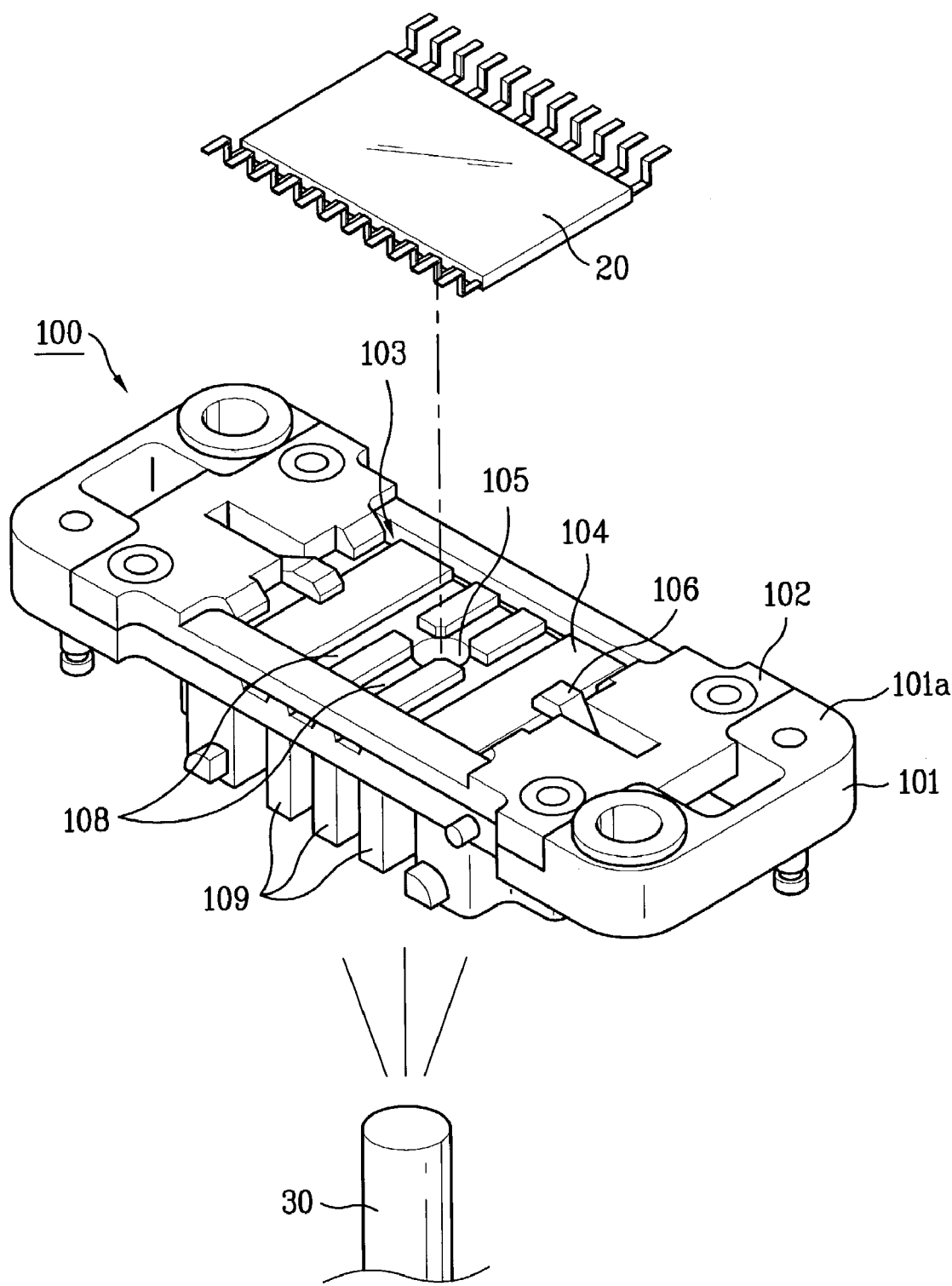
FIG. 5 is a schematic perspective view of a carrier module in accordance with an embodiment of the invention.
Figure 6:
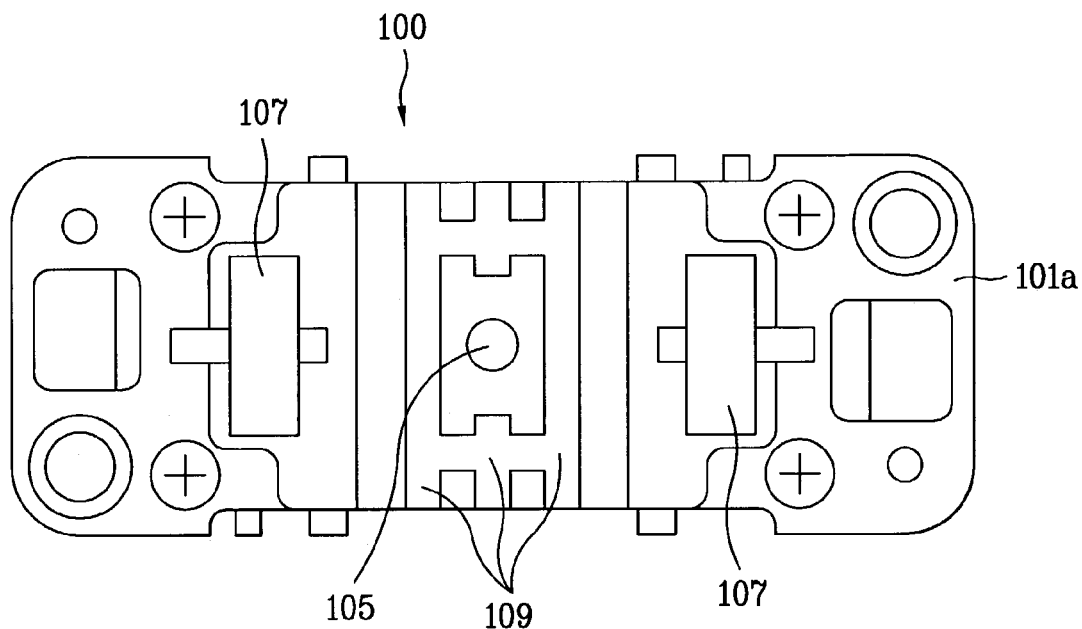
FIG. 6 is a schematic bottom view of the carrier module of FIG. 5.
Figure 7:
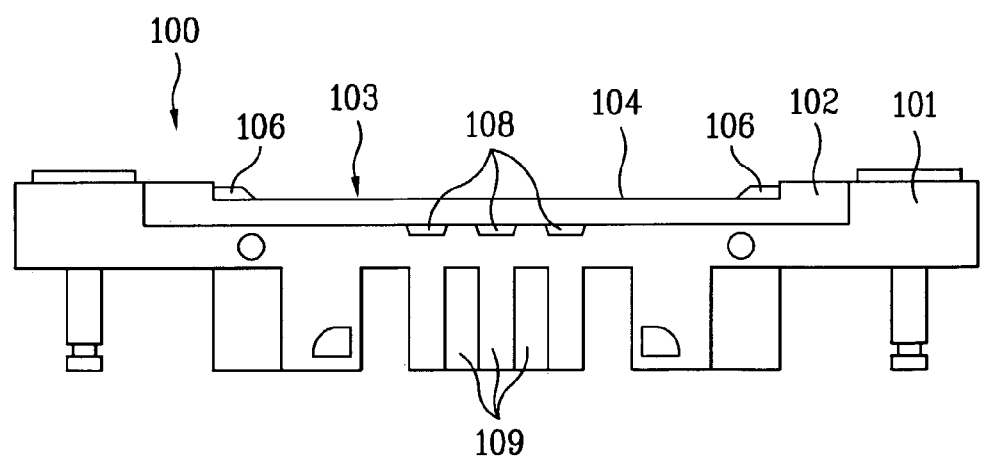
FIG. 7 is a schematic side view of the carrier module of FIG. 5.

Reference will now be made in detail to the embodiments of the invention, examples of which are illustrated in the accompanying drawings FIGS. 4–6.

FIGS. 4–7 show a test tray 200 with a carrier module 100 configured to be fitted to the test tray 200. The carrier module 100 includes a carrier body 101. In the embodiment shown in FIGS. 4–7, the carrier body 101 is substantially rectangular; however, other shapes may also be appropriate. A device seating plate 102 is positioned on a top surface 101a of the carrier body 101 and includes an opening 103 configured to receive a semiconductor device 20 in a central portion thereof The opening 103 in the device seating plate 102 is configured to receive the semiconductor device 20, together with the top surface 101a of the body 101. For purposes of explanation, a portion of the top surface 101a of the body 101 within the opening 103 will be defined as a device seating surface 104.

The carrier body 101 is preferably formed of a material with a good thermal conductivity, for example, a metal such as aluminum. The device seating plate 102 may be formed of, for example, plastic. Alternatively, the device seating plate 102 may be formed of the same material as the body 101, or as one unit with the body 101.

One or more holding members 106 are provided to detachably hold the semiconductor device seated on the device seating surface 104. In the embodiment of FIGS. 4–7, the holding members 106 are provided at opposite sides of the device seating surface 104. The holding members 106 may be, for example, a pair of latches 106 and a corresponding pair of latch moving pieces 107, as in the embodiment of FIGS. 4–7. The latches 106 are opened as the latch moving pieces 107 are pressed, and closed as the force pressing the latch moving pieces 107 are removed.

A pass through hole 105 is provided in a central portion of the device seating surface 104. The pass through hole 105 guides the cooling fluid sprayed from the nozzle assembly 30 of the test temperature deviation compensation system toward the semiconductor device 20. The device seating surface 104 further includes a plurality of guide grooves 108, each having one end opened to and in communication with the pass through hole 105 and the other end opened to an outside of the body 101. The guide grooves 108 guide the cooling fluid, passed through the pass through hole 105, throughout an entire surface of the semiconductor device 20 before being discharged to outside the carrier body 101.

A plurality of guide ribs 109 are provided on a lower portion of the body 101. The guide ribs 109 may be formed as a unit with the body 101. The guide ribs 109 guide the cooling fluid sprayed from the nozzle assembly 30 toward the pass through hole 105. In this embodiment, the plurality of guide ribs 109 form a polyhedral form having an opened bottom surface to surround the pass through hole 105. However, other shapes may also be appropriate. Accordingly, the escape of the cooling fluid sprayed into the space formed by the guide ribs 109 can be prevented, thereby increasing cooling efficiency.

The operation of the foregoing carrier module will be explained as follows.

A semiconductor device 20 is seated on the device seating surface 104 on the carrier body 101 of the carrier module 100 and is held by the holding members 106. After a test tray 200 having the carrier module 100 fitted thereto is transported to the test chamber (not shown), leads on the semiconductor device 20 held by the carrier module 100 are connected to a test socket (not shown), and a test is carried out.

A cooling fluid formed of a mixture of dry air and liquefied gas, such as liquefied nitrogen $LN_2$, is sprayed from the nozzle assembly 30 of the test temperature deviation compensation system (not shown) toward the carrier module 100. The cooling fluid is guided to the pass through hole 105 through a space formed by the guide ribs 109 of the carrier module 100. Since the majority of the cooling fluid introduced into the space formed by the guide ribs 109 is contained within the space formed by the guide ribs 109, efficiency of the cooling process is enhanced, as the cooling fluid is able to expend its full heat exchange capacity.

The cooling fluid passed through the pass through hole 105 is guided to the guide grooves 108, which are in fluid communication with the pass through hole 105. The cooling fluid flows toward a periphery of the semiconductor device 20, cools the semiconductor device 20, and is discharged to outside of the carrier module 100 through an outer side of the carrier body 101.

As explained above, the test tray with carrier modules for a semiconductor device handler according to the invention has at least the following advantages.

The test tray with carrier modules for a semiconductor device handler according to the invention improves the effect of test temperature deviation compensation when a test temperature deviation device sprays cooling fluid onto the semiconductor device during testing of the semiconductor device at a test site of the semiconductor device handler. Since the cooling fluid sprayed from the test temperature deviation compensation system is forced to flow not only to a central portion of the semiconductor device, but also to its periphery, cooling the semiconductor device can be improved.

The foregoing embodiments and advantages are merely exemplary and are not to be construed as limiting the invention. The present teaching can be readily applied to other types of apparatuses. The description of the invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A carrier module for a semiconductor device handler, the carrier module configured to be fitted to a test tray in a semiconductor device handler and configured to detachably hold a semiconductor device, the carrier module comprising:
    a carrier body configured to be positioned on a test tray;
    a device seating part on a top surface of the carrier body configured to receive a semiconductor device;
    at least one holding member configured to detachably hold the semiconductor device on the device seating part;
    a pass through hole formed in the device seating part configured to allow cooling fluid to pass therethrough; and
    a plurality of guide grooves formed in a surface of the device seating part, wherein the plurality of guide grooves are in fluid communication with the pass through hole and are configured to guide cooling fluid, which is sprayed onto a lower side of the carrier body and passed through the pass through hole, across portions of the surface of the semiconductor device beginning at a substantially central portion of the semiconductor device and extending to peripheral portions of the semiconductor device, wherein the plurality of guide grooves are interconnected to form a continuous flow path for the cooling fluid.

2. The carrier module as claimed in claim 1, wherein a plurality of the guide grooves are configured to guide cooling fluid across more than 25% of a surface of a semiconductor device mounted on the device seating part.

3. The carrier module as claimed in claim 1, wherein the carrier body is substantially rectangular.

4. The carrier module as claimed in claim 1, wherein the at least one holding member comprises a pair of holding members fitted to opposite sides of the device seating part and configured to detachably hold the semiconductor device on the device seating part.

5. The carrier module as claimed in claim 1, further comprising a plurality of guide ribs formed on a lower portion of the carrier body and configured to guide the cooling fluid sprayed onto a lower side of the carrier body toward the pass through hole.

6. The carrier module as claimed in claim 5, wherein the plurality of guide ribs extend vertically from a lower portion of the carrier body.

7. The carrier module as claimed in claim 5, wherein the plurality of guide ribs are interconnected to form a closed flow path that guides cooling fluid towards the pass through hole.

8. The carrier module as claimed in claim 5, wherein the plurality of guide ribs are formed as one unit with the carrier body.

9. The carrier module as claimed in claim 6, wherein side faces of the plurality of guide ribs which face the pass through hole form a polyhedron with an opened lower surface which surrounds the pass through hole.

10. The carrier module as claimed in claim 1, wherein the seating part is formed as a recess in the top surface of the carrier body.

11. The carrier module as claimed in claim 1, wherein the device seating part includes a device seating plate fixed to a top surface of the carrier body and having an opening configured to receive therein the semiconductor device in a central portion thereof.

12. The carrier module as claimed in claim 11, wherein the device seating plate is formed of a non-conductive material.

13. The carrier module as claimed in claim 12, wherein the device seating plate is formed of plastic.

14. The carrier module as claimed in claim 11, wherein the device seating plate is formed of the same material as the carrier body.

15. The carrier module as claimed in claim 1, wherein the carrier body is formed of a material having a thermal conductivity similar to metal.

16. The carrier module as claimed in claim 15, wherein the carrier body is formed of aluminum.

17. The carrier module as claimed in claim 1, wherein the plurality of guide grooves are opened to an outside of the body such that cooling fluid can be discharged from the guide grooves of the device seating part.

18. The carrier module as claimed in claim 1, wherein the plurality of guide grooves are formed between adjacent protrusions of a plurality of protrusions which protrude upward from an upper surface of the device seating part toward a bottom surface of a semiconductor device mounted in the device seating part.

19. A carrier module configured to detachably hold a semiconductor device and to be fitted to a test tray of a semiconductor device handler, the carrier module comprising:
- a carrier body configured to be positioned on a test tray;
- a device seating part provided on a top surface of the carrier body and configured to receive a semiconductor device;
- at least one holding member configured to detachably hold the semiconductor device on the device seating part;
- a plurality of guide grooves formed along a surface of the device seating part and configured to disperse cooling fluid across portions of a lower surface of the semiconductor device mounted in the device seating part; and
- a plurality of guide ribs extending downward from a lower surface of the carrier body, wherein the plurality of guide ribs surround a pass through hole formed in the device seating part, and wherein the plurality of guide ribs are configured to receive cooling fluid from an external source and convey the cooling fluid to the plurality of guide grooves via the pass through hole.

20. The carrier module as claimed in claim 19, wherein the plurality of guide ribs are interconnected, and the plurality of guide grooves are interconnected.

21. The carrier module as claimed in claim 19, wherein the plurality of guide grooves are configured to discharge cooling fluid to an outside of the carrier body via openings formed in portions the carrier body corresponding to ends of the plurality of guide grooves.

22. The carrier module as claimed in claim 19, wherein the plurality of guide grooves are configured to disperse cooling fluid across portions of the semiconductor device beginning at a substantially central portion of the semiconductor device, and extending to peripheral portions of the semiconductor device.

23. A carrier module for a device semiconductor handler, comprising:
- a carrier body configured to be positioned on a test tray, including a receiving portion provided on an upper portion thereof and configured to receive a semiconductor device;
- a plurality of guide ribs formed on a lower portion of the carrier body and configured to guide cooling fluid toward a pass through hole formed in the receiving portion which is in fluid communication with a plurality of guide grooves formed on an upper portion of the receiving portion so as to disperse the cooling fluid throughout the plurality of guide grooves.

* * * * *